(12) United States Patent
Watanabe et al.

(10) Patent No.: US 7,381,145 B2
(45) Date of Patent: Jun. 3, 2008

(54) APPARATUS FOR OPENING AND CLOSING COVER

(75) Inventors: Kouji Watanabe, Mie (JP); Toshihiro Yudate, Mie (JP)

(73) Assignee: TS Corporation, Tokyo (JP)

( * ) Notice: Subject to any disclaimer, the term of this patent is extended or adjusted under 35 U.S.C. 154(b) by 0 days.

(21) Appl. No.: 11/697,820

(22) Filed: Apr. 9, 2007

(65) Prior Publication Data
US 2007/0179005 A1    Aug. 2, 2007

Related U.S. Application Data

(63) Continuation of application No. 10/896,661, filed on Jul. 22, 2004, now Pat. No. 7,213,481.

(30) Foreign Application Priority Data

Jul. 22, 2003    (JP)    ............... P2003-277497

(51) Int. Cl.
*F16H 48/06* (2006.01)
*F16H 48/12* (2006.01)

(52) U.S. Cl. ..................... 475/221; 475/149
(58) Field of Classification Search ............... 475/170, 475/221, 149, 903, 904; 74/393, 721, 650, 74/640
See application file for complete search history.

(56) References Cited

U.S. PATENT DOCUMENTS 4,637,283 A * 1/1987 Bertram et al. ............... 81/3.2
4,690,010 A * 9/1987 Matsumoto et al. .......... 74/469
4,898,065 A * 2/1990 Ogata et al. ................ 475/179
5,587,635 A   12/1996 Watanabe et al.
5,620,387 A   4/1997 Janiszewski
6,029,532 A * 2/2000 Phillips ..................... 74/421 R
6,413,186 B1  7/2002 Hattori
6,796,921 B1 * 9/2004 Buck et al. ................. 475/299
7,086,978 B2  8/2006 Aikawa et al.

FOREIGN PATENT DOCUMENTS

JP    2001-021039 A    1/2001

* cited by examiner

*Primary Examiner*—Tisha Lewis
(74) *Attorney, Agent, or Firm*—Panitch Schwarze Belisario & Nadel LLP (57) ABSTRACT

An activating device for a cover has: a shaft unit having a rotary shaft; an arm unit which is coupled to the cover and the rotary shaft; and an actuator which drives the rotary shaft. The actuator has: a motor having a first output portion; a first reducer having an input portion and an output portion; and a second reducer having an input portion and an output portion. The reciprocal of a reduction ratio of the second reducer is larger than a quotient which is obtained by dividing a product by a torque that is required for rotating the output portion when a torque is not applied to the input portion, the product being obtained by multiplying a difference between a maximum torque that is applied to the output portion when the cover is opened, and a torque that is required for rotating the output portion when a torque is not applied to the input portion, with a ratio of a torque that is a remainder of a torque applied to the output portion after subjecting to a mechanical loss due to the second reducer, to the torque applied to the output portion.

4 Claims, 5 Drawing Sheets

APPARATUS FOR OPENING AND CLOSING COVER

CROSS-REFERENCE TO RELATED APPLICATIONS

This application is a Continuation of U.S. patent application Ser. No. 10/896,661, filed Jul. 22, 2004 now U.S. Pat. No. 7,213,481, the disclosure of which is incorporated herein by reference.

BACKGROUND OF THE INVENTION

The present invention relates to a cover activating device for opening and closing a cover of a container.

Conventionally, as an activating device for a cover of a container, known is an apparatus in which the cover is disposed openably and closably on a container via an arm that is coupled so as to be rotatable integrally with a shaft rotatably supported by the container, and which comprises a gas spring for enabling the arm to be rotatable, and a worm gear for allowing the shaft to be rotatable (for example, see JP-A-2001-21039 (Page 3, FIGS. 3 and 4)).

However, the conventional activating device for a cover is configured by the gas spring for enabling the arm to be rotatable, and the worm gear for allowing the shaft to be rotatable, and hence has a problem in that the apparatus has a large size.

BRIEF SUMMARY OF THE INVENTION

The invention has been conducted in order to solve the problem of the conventional art. It is an object of the invention to provide an activating device for a cover which can be made smaller in size than a conventional apparatus.

The activating device for a cover of the invention has a configuration wherein the apparatus comprises: a shaft unit which is supported by a case of a container having the case and a cover, and which has a rotary shaft; an arm unit which is coupled to the cover and the rotary shaft; and an actuator which drives the rotary shaft, the actuator comprises: a motor having a first output portion from which power is output; a first reducer having a first input portion which receives the power from the first output portion, and a second output portion from which power is output, the first reducer reducing the output of the motor; and a second reducer having a second input portion which receives the power from the second output portion, and a third output portion from which power is output to the rotary shaft, the second reducer reducing the output of the first reducer, and a reciprocal ($R_2$) of a reduction ratio of the second reducer is larger than a quotient which is obtained by dividing a product by a torque ($T_{R1}$) that is required for rotating the second output portion when a torque is not applied to the first input portion, the product being obtained by multiplying a difference between a maximum torque ($T_L$) that is applied to the third output portion when the cover is opened, and a torque ($T_{R2}$) that is required for rotating the third output portion when a torque is not applied to the second input portion, with a ratio ($\eta_2$) of a torque that is a remainder of a torque applied to the third output portion after subjecting to a mechanical loss due to the second reducer, to the torque applied to the third output portion.

According to the configuration, in the activating device for a cover of the invention, closing of the cover due to its own weight can be suppressed by the actuator which drives the cover. Therefore, the apparatus can be made smaller in size than a conventional apparatus.

The activating device for a cover of the invention has a configuration wherein each of the first reducer and the second reducer includes a differential gear reduction mechanism.

According to the configuration, in the activating device for a cover of the invention, closing of the cover due to its own weight is suppressed by the differential gear reduction mechanism which transmits power at a higher efficiency than that of a worm gear. Therefore, the efficiency of transmission of power to the cover can be improved as compared with the case where closing of a cover due to its own weight is suppressed by a worm gear.

The activating device for a cover of the invention has a configuration wherein each of the first reducer and the second reducer includes: a first stage reduction mechanism which is a reduction mechanism other than the differential gear reduction mechanism; and a second stage reduction mechanism which is the differential gear reduction mechanism.

According to the configuration, in the activating device for a cover of the invention, the reduction ratio of the first reducer or the second reducer can be controlled simply by adjusting the reduction ratio of the first stage reduction mechanism. Therefore, the reduction ratio of the first reducer or the second reducer can be easily controlled as compared with the case where the reduction ratio of the first reducer or the second reducer can be controlled only after the reduction ratio of a differential gear reduction mechanism is adjusted.

According to the invention, it is possible to provide an activating device for a cover which can be made smaller in size than a conventional apparatus.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Hereinafter, an embodiment of the invention will be described with reference to the accompanying drawings.

First, the configuration of a cover activating device of the embodiment will be described.

Figure 1:
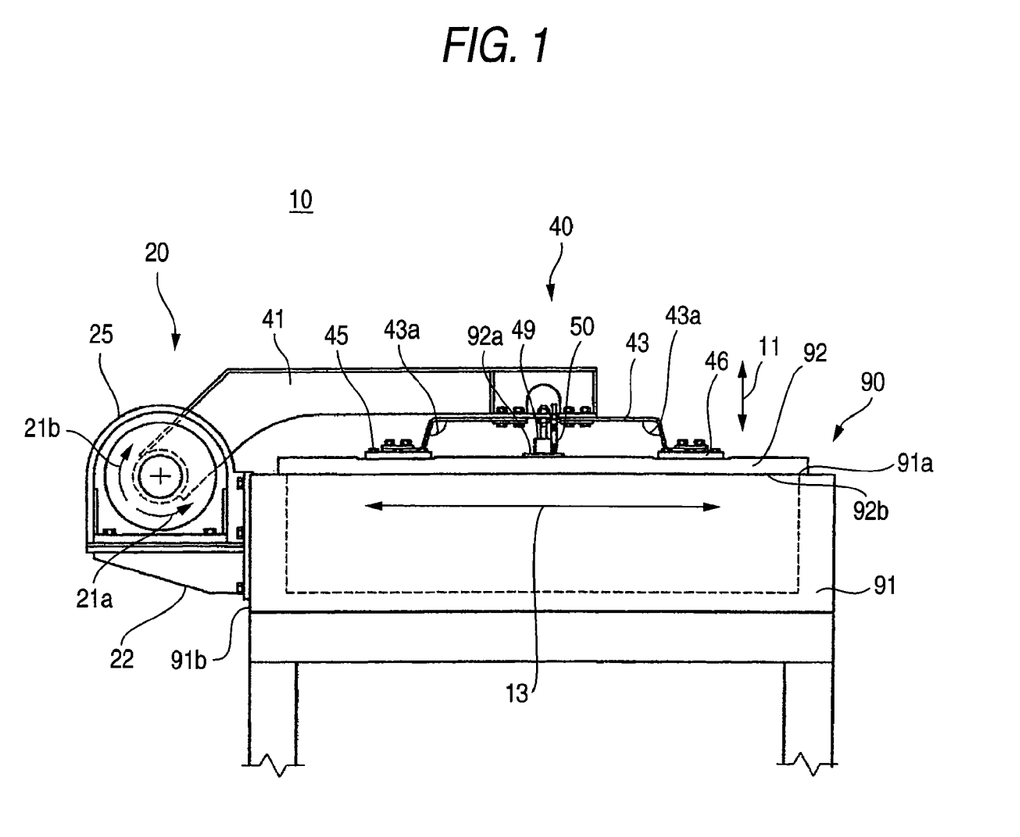
FIG. 1 is a side view of a vacuum chamber and a cover activating device of an embodiment of the invention in a state where a cover of the vacuum chamber is closed.
Figure 2:
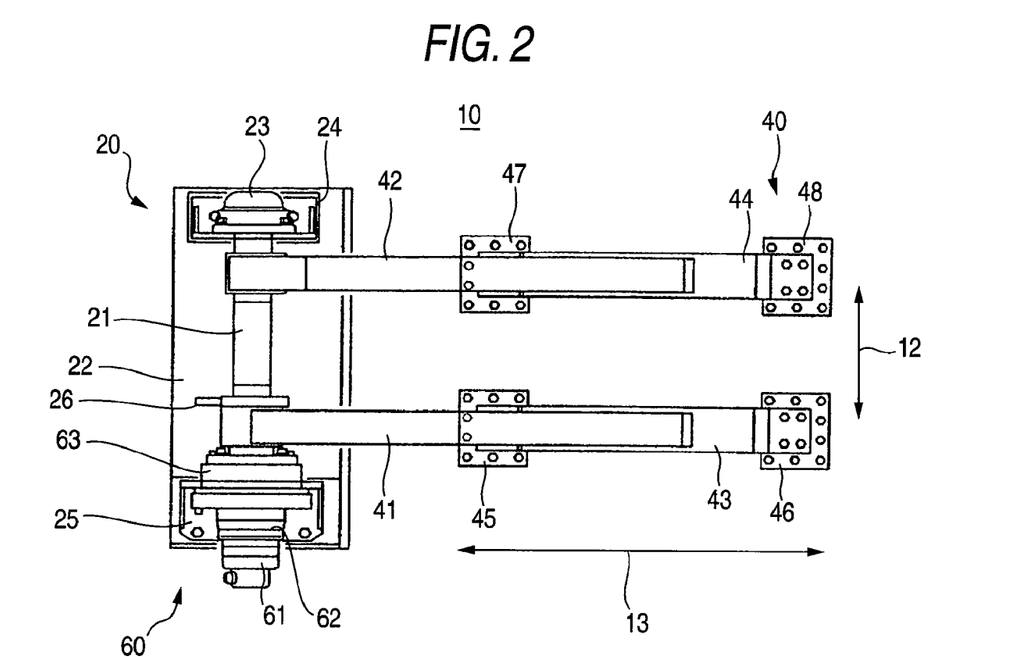
FIG. 2 is a top plan view of the cover activating device shown in FIG. 1.

As shown in FIGS. 1 and 2, the cover activating device 10 of the embodiment comprises: a shaft unit 20 which is supported by a vacuum chamber (container) 90 for producing a semiconductor device and having a case 91 and a cover 92, and which has a rotary shaft 21; an arm unit 40 which is coupled to the cover 92 and the rotary shaft 21; and an actuator 60 which drives the rotary shaft 21.

In the case 91 of the vacuum chamber 90, an O-ring which is not shown, and which serves as a sealing member to be in contact with the cover 92 is disposed on an opening face 91a. The O-ring of the case 91 has a thickness of 1 mm when the O-ring is not in contact with the cover 92. The cover 92 has a plate 92a on the side opposite to the case 91.

The shaft unit 20 comprises: a base 22 which is fixed to one of four side faces of the case 91 or a side face 91b; a bearing unit 23 which rotatably supports the rotary shaft 21; a bearing bracket 24 through which the bearing unit 23 is fixed to the base 22; and an actuator bracket 25 through which the actuator 60 is fixed to the base 22.

Figure 3:
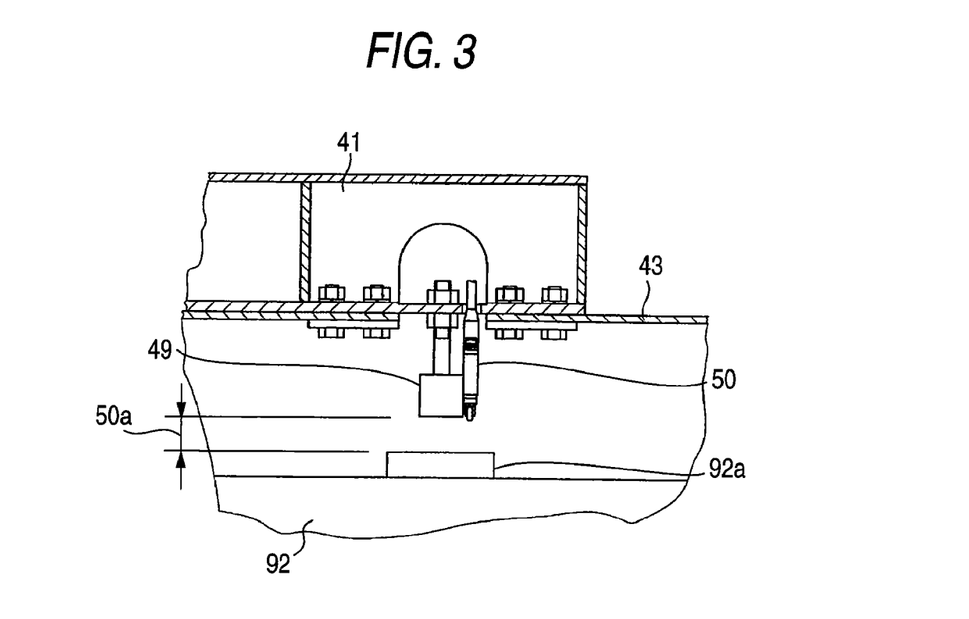
FIG. 3 is a side section view partly showing the vacuum chamber and the cover activating device shown in FIG. 1.

The arm unit 40 comprises: arms 41, 42 which are fixed to the rotary shaft 21; plate springs 43, 44 which are fixed respectively to the arms 41, 42; spring seat plates 45, 46 which are fixed to the plate spring 43, and also to the cover 92; spring seat plates 47, 48 which are fixed to the plate spring 44, and also to the cover 92; a block 49 which is fixed to the arm 41; and a sensor 50 which is fixed to the block 49 to measure a gap 50a (see FIG. 3) between the block 49 and the plate 92a.

The plate spring 43 is made of, for example, a metal material, and, when the cover 92 is closed, has a bending angle 43a of 105°. The spring constants in the thickness direction of the cover 92 indicated by the arrow 11, in the direction along which the rotary shaft 21 elongates, and which is indicated by the arrow 12, and in the direction which is substantially perpendicular to the directions of the arrows 11 and 12, and which is indicated by the arrow 13 are 74 N/mm, 336 N/mm, and 900 N/mm, respectively. The plate spring 44 is configured in the same manner as the lead spring 43.

The shaft unit 20 further comprises a stopper 26 which is to be in contact with the arm 41, thereby preventing an angle 90a (see FIG. 4) formed by the opening face 91a of the case 91 and a face 92b of the cover 92 which is in contact with the O-ring of the case 91, from becoming larger than 105°.

Figure 5:
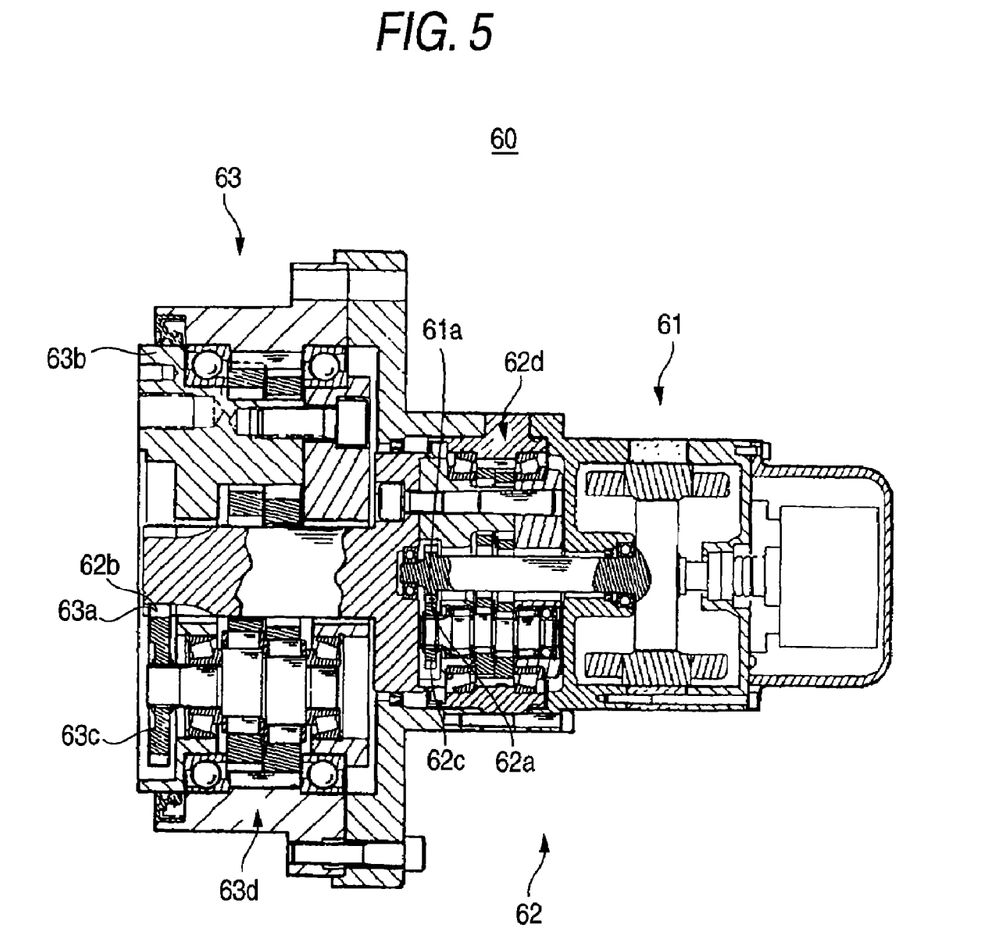
FIG. 5 is a partially cutaway section view of an actuator of the cover activating device shown in FIG. 1.

As shown in FIG. 5, the actuator 60 comprises: a motor 61 having an output portion 61a serving as a first output portion from which power is output; a first reducer 62 having an input portion 62a serving as a first input portion which receives the power from the output portion 61a of the motor 61, and an output portion 62b serving as a second output portion from which power is output, the first reducer reducing the output of the motor 61 at a reduction ratio of 1/57; and a second reducer 63 having an input portion 63a serving as a second input portion which receives the power from the output portion 62b of the first reducer 62, and an output portion 63b serving as a third output portion from which power is output to the rotary shaft 21 (see FIG. 2), the second reducer reducing the output of the first reducer 62 at a reduction ratio of 1/141. Namely, the first reducer 62 and the second reducer 63 transmit the output of the motor 61 to the rotary shaft 21 with reducing the output at a reduction ratio of 1/8,037.

The first reducer 62 is a two-stage reducer having: a spur gear 62c which is a first stage reduction mechanism, and which constitutes the input portion 62a; and a differential gear reduction mechanism 62d which is a second stage reduction mechanism. The spur gear 62c which meshes with a gear disposed in the output portion 61a of the motor 61 reduces the speed of transmits the output of the motor 61 at a reduction ratio which is equal to or larger than 1/5 and smaller than 1/1, or transmits the output at a ratio of 1/1.

Similarly, the second reducer 63 is a two-stage reducer having: a spur gear 63c which is a first stage reduction mechanism, and which constitutes the input portion 63a; and a differential gear reduction mechanism 63d which is a second stage reduction mechanism. The spur gear 63c which meshes with a gear disposed in the output portion 62b of the first reducer 62 reduces the speed of the output of the first reducer 62 at a reduction ratio which is equal to or larger than 1/5 and smaller than 1/1, or transmits the output at a ratio of 1/1.

The reciprocal (hereinafter, referred to as "speed rate") of the reduction ratio of the second reducer 63 is indicated by $R_2$. The maximum torque which, when the cover 92 is opened, is applied to the output portion 63b of the second reducer 63 is indicated by $T_L$. A torque which, when a torque is not applied to the input portion 62a of the first reducer 62, is required for rotating the output portion 62b of the first reducer 62 is indicated by $T_{R1}$. A torque which, when a torque is not applied to the input portion 63a of the second reducer 63, is required for rotating the output portion 63b of the second reducer 63 is indicated by $T_{R2}$. A ratio of a torque which is a remainder of a torque applied to the output portion 63b of the second reducer 63 after subjecting to a mechanical loss due to the second reducer 63, to the torque applied to the output portion 63b of the second reducer 63 is indicated by $\eta_2$. In this case, the speed rate $R_2$ is set so as to be larger than a quotient which is obtained by dividing a product of the difference between the maximum value $T_L$ and the torque $T_{R2}$, and the ratio $\eta_2$, by the torque $T_{R1}$, or so as to satisfy Expression 1 below.

$$R_2 > \frac{(T_L - T_{R2}) \times \eta_2}{T_{R1}} \qquad \text{[Expression 1]}$$

Figure 4:
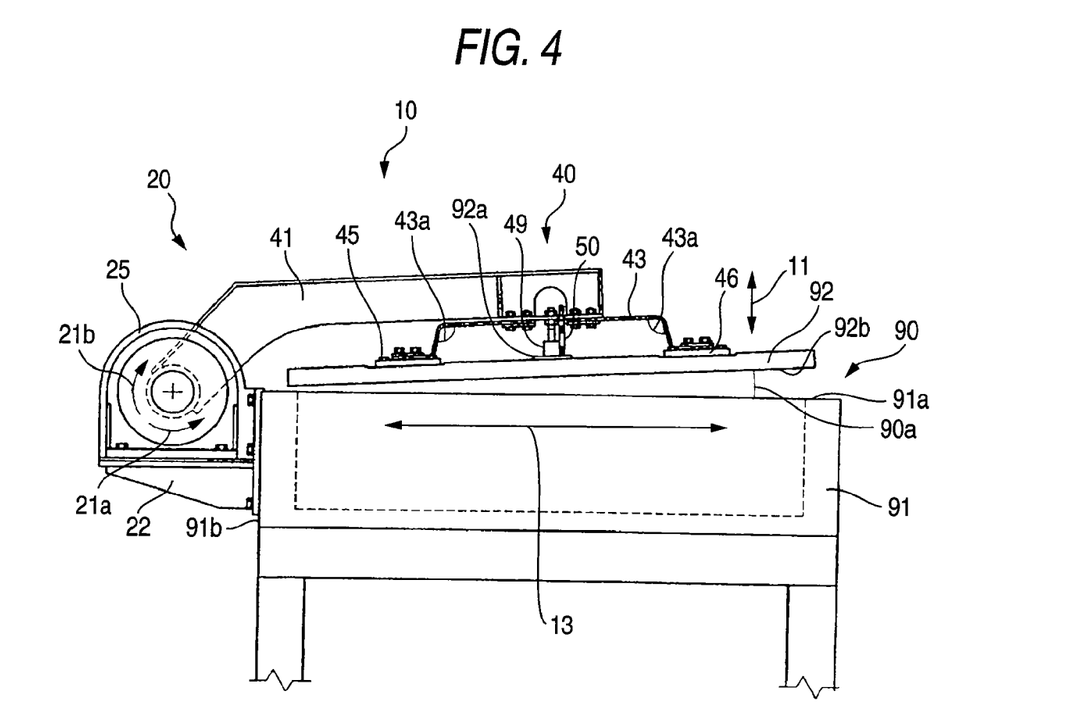
FIG. 4 is a side view of the vacuum chamber shown in FIG. 1, and the cover activating device shown in FIG. 1 in a state where the cover of the vacuum chamber is opened by a small angle.

Specifically, in the cover activating device 10 shown in FIG. 1, a torque of 4,606 N·m which is applied to the output portion 63b of the second reducer 63 when the cover 92 is separated from the O-ring of the case 91 by a small distance as shown in FIG. 4 is the maximum value $T_L$, the torque $T_{R1}$ is 33 N·m, the torque $T_{R2}$ is 154 N·m, the ratio $\eta_2$ is 0.8, and the speed rate $R_2$ is 141. Therefore, the speed rate $R_2$ satisfies Expression 1 as indicated by Expression 2 below.

$$\frac{(T_L - T_{R2}) \times \eta_2}{T_{R1}} = \frac{(4606 - 154) \times 0.8}{33} \qquad \text{[Expression 2]}$$

$$\cong 107.9 < 141$$

$$= R_2$$

The cover activating device 10 further comprises a control unit which controls the output of the motor 61, and which is not shown.

The position of the block 49 with respect to the arm 41 is previously adjusted so that, when the cover 92 is closed by the control unit as shown in FIG. 1, the gap 50a (see FIG. 3) with respect to the plate 92a is 1 mm, and, when the cover 92 is separated from the O-ring of the case 91 by a small distance as shown in FIG. 4, the gap 50a is 3 mm.

Next, the operation of the cover activating device 10 will be described.

(1) Operation when the cover activating device 10 opens the cover 92

When the cover 92 is closed as shown in FIG. 1, the arms 41, 42 press the cover 92 toward the case 91 via the plate springs 43, 44 and the spring seat plates 45 to 48, and hence the O-ring of the case 91 is compressed by the cover 92. The gap 50a (see FIG. 3) between the block 49 and the plate 92a is 1 mm, and the bending angle 43a of the plate spring 43 and the bending angle of the plate spring 44 are 105°.

When the cover activating device 10 is to open the cover 92, the control unit drives the motor 61 so that the rotary shaft 21 is rotated by the actuator 60 in the direction indicated by the arrow 21a. Specifically, the control unit controls the actuator 60 so as to rotate the rotary shaft 21 at a constant acceleration in the direction of the arrow 21a so that the rotational speed of the rotary shaft 21 is changed from 0 deg/sec to 0.13 deg/sec in 0.13 sec, then rotate the rotary shaft 21 at 0.13 deg/sec for 12.18 sec in the direction of the arrow 21a, and further rotate the rotary shaft 21 at a constant deceleration in the direction of the arrow 21a so that the rotational speed of the rotary shaft 21 is changed from 0.13 deg/sec to 0 deg/sec in 0.13 sec.

Therefore, the cover 92 which is coupled to the rotary shaft 21 via the spring seat plates 45 to 48, the plate springs 43, 44, and the arms 41, 42 is released from the state of adhering with the O-ring of the case 91, to be separated from the O-ring of the case 91.

When the cover 92 is opened, the arms 41, 42 pull the plate springs 43, 44 in the direction opposite to the cover 92, and hence the bending angle 43a of the plate spring 43 and the bending angle of the plate spring 44 are larger than 105°, and the gap 50a (see FIG. 3) between the block 49 and the plate 92a is larger than 1 mm.

In order to reduce swinging of the cover 92 which is released from the state of adhering with the O-ring of the case 91, the control unit controls the actuator 60 so as to stop for 2 sec. and then drives the motor 61 so that the rotary shaft 21 is again rotated by the actuator 60 in the direction of the arrow 21a. Specifically, the control unit controls the actuator 60 so as to rotate the rotary shaft 21 at a constant acceleration in the direction of the arrow 21a so that the rotational speed of the rotary shaft 21 is changed from 0 deg/sec to 1.059 deg/sec in 1.06 sec, then rotate the rotary shaft 21 at 1.059 deg/sec for 87.705 sec in the direction of the arrow 21a, and further rotate the rotary shaft 21 at a constant deceleration in the direction of the arrow 21a so that the rotational speed of the rotary shaft 21 is changed from 1.059 deg/sec to 0 deg/sec in 1.06 sec.

When the cover 92 is opened by the cover activating device 10, the rotary shaft 21 is rotated in total by about 95.6° in the direction of the arrow 21a as a result of the series of above-described operations. However, the plate springs 43, 44 are deformed, and hence the angle 90a (see FIG. 4) formed by the opening face 91a of the case 91 and the face 92b of the cover 92 is not 95.6° but 95°.

(2) Operation when the cover activating device 10 closes the cover 92

When the cover 92 is closed by the cover activating device 10 in the case where the angle 90a (see FIG. 4) formed by the opening face 91a of the case 91, and the face 92b of the cover 92 is 95°, the control unit drives the motor 61 so that the rotary shaft 21 is rotated by the actuator 60 in the direction indicated by the arrow 21b. Specifically, the control unit controls the actuator 60 so as to rotate the rotary shaft 21 at a constant acceleration in the direction of the arrow 21b so that the rotational speed of the rotary shaft 21 is changed from 0 deg/sec to 1.059 deg/sec in 1.06 sec, then rotate the rotary shaft 21 at 1.059 deg/sec for 87.705 sec in the direction of the arrow 21b, and further rotate the rotary shaft 21 at a constant deceleration in the direction of the arrow 21a so that the rotational speed of the rotary shaft 21 is changed from 1.059 deg/sec to 0 deg/sec in 1.06 sec.

In order to reduce swinging of the cover 92, the control unit controls the actuator 60 so as to stop for 2 sec, and then drives the motor 61 so that the rotary shaft 21 is again rotated by the actuator 60 in the direction of the arrow 21b. Specifically, the control unit controls the actuator 60 so as to rotate the rotary shaft 21 at a constant acceleration in the direction of the arrow 21b so that the rotational speed of the rotary shaft 21 is changed from 0 deg/sec to 0.13 deg/sec in 0.13 sec, then rotate the rotary shaft 21 at 0.13 deg/sec for 12.18 sec in the direction of the arrow 21b, and further rotate the rotary shaft 21 at a constant deceleration in the direction of the arrow 21b so that the rotational speed of the rotary shaft 21 is changed from 0.13 deg/sec to 0 deg/sec in 0.13 sec.

Therefore, the cover 92 which is coupled to the rotary shaft 21 via the spring seat plates 45 to 48, the plate springs 43, 44, and the arms 41, 42 is in contact with the O-ring of the case 91 in the state where the cover compresses the O-ring of the case 91.

When the cover 92 is closed, the arms 41, 42 press the plate springs 43, 44 toward the cover 92, and hence the bending angle 43a of the plate spring 43 and the bending angle of the plate spring 44 are 105°, and the gap 50a (see FIG. 3) between the block 49 and the plate 92a is 1 mm.

When the cover 92 is closed by the cover activating device 10, the rotary shaft 21 is rotated in total by about 95.6° in the direction of the arrow 21b as a result of the series of above-described operations. However, the plate springs 43, 44 are deformed, and hence the angle 90a (see FIG. 4) formed by the opening face 91a of the case 91 and the face 92b of the cover 92 which is in contact with the O-ring of the case 91 is not −0.6° but 0°.

Irrespective of whether the cover 92 is being opened by the cover activating device 10 or the cover 92 is being closed by the cover activating device 10, when a torque is applied to the output portion 63b of the second reducer 63 by the weight of the cover 92 in the state where the cover 92 is opened, a torque which is transmitted by the weight of the cover 92 to the output portion 62b of the first reducer 62 via the input portion 63a of the second reducer 63 is equal to or smaller than the value indicated by Expression 3 below.

$$\frac{(T_L - T_{R2}) \times \eta_2}{R_2} \qquad \text{[Expression 3]}$$

When the torque $T_{R1}$ is larger than the value indicated by Expression 3 above, or satisfies Expression 4 below, the output portion 62b of the first reducer 62 is not rotated by the weight of the cover 92.

$$T_{R1} > \frac{(T_L - T_{R2}) \times \eta_2}{R_2} \quad \text{[Expression 4]}$$

In the cover activating device 10, since the speed rate $R_2$ is set so as to satisfy Expression 1, the torque $T_{R1}$ satisfies Expression 4, and, when the cover 92 is opened, closing of the cover 92 due to its own weight is suppressed by the actuator 60.

Figure 6:
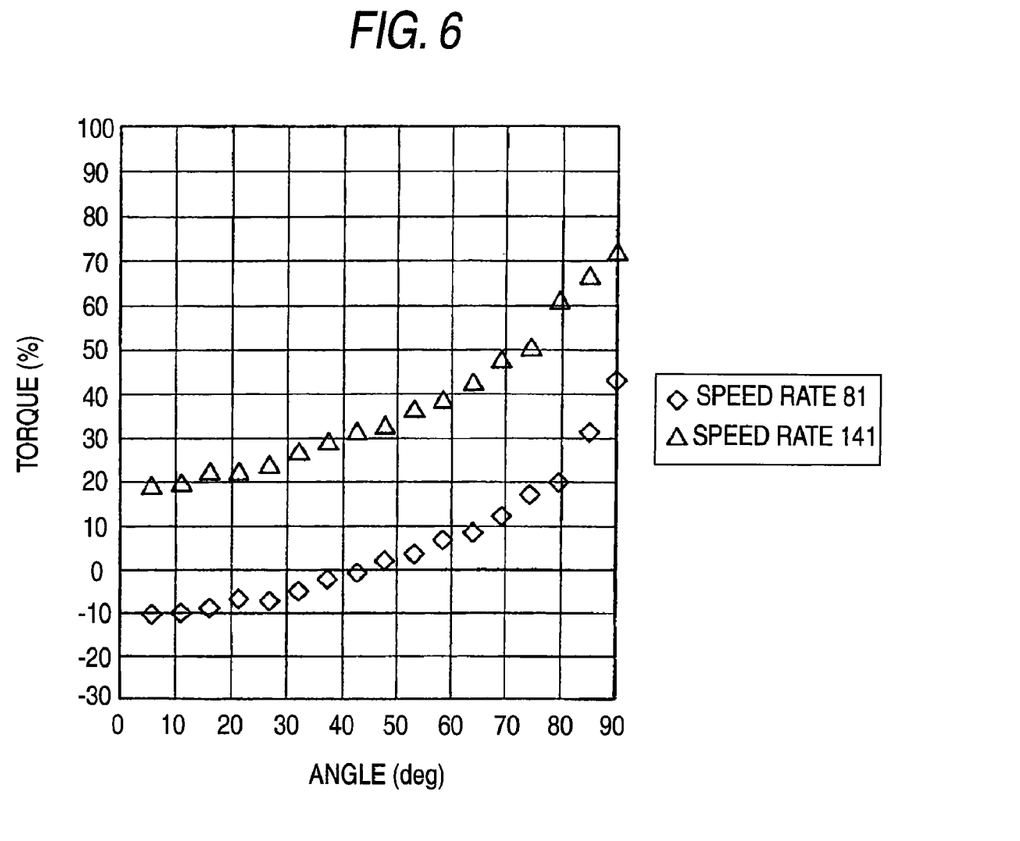
FIG. 6 is a view showing relationships between a speed rate of a second reducer of the actuator shown in FIG. 5, an angle formed by a case of the vacuum chamber shown in FIG. 1 and a cover, and a ratio of a torque of a motor of the actuator shown in FIG. 5 required for closing the cover to a rated torque of the motor.

For example, the speed rate $R_2$, the angle 90a (see FIG. 4) formed by the opening face 91a of the case 91 and the face 92b of the cover 92, and a ratio of the torque of the motor 61 required for closing the cover 92 to the rated torque of the motor 61 have relationships shown in FIG. 6. When the speed rate $R_2$ is 81 which is smaller than 107.9 indicated by Expression 2, and the angle 90a is larger than about 45°, the torque of the motor 61 is required for closing the cover 92, and hence the cover activating device 10 can suppress closing of the cover 92 due to its own weight. When the speed rate $R_2$ is 81 and the angle 90a is equal to or smaller than about 45°, the torque of the motor 61 is not required for closing the cover 92, and hence the cover activating device 10 cannot suppress closing of the cover 92 due to its own weight. By contrast, in the case where the speed rate $R_2$ is 141 which is larger than 107.9 indicated by Expression 2, when the angle 90a is equal to or larger than 0° and equal to or smaller than 90°, the torque of the motor 61 is always required for closing the cover 92, and hence the cover activating device 10 can suppress closing of the cover 92 due to its own weight.

As described above, in the cover activating device 10, closing of the cover 92 due to its own weight can be suppressed, by the actuator 60 which drives the cover 92. Therefore, the apparatus can be made smaller in size than a conventional apparatus.

In the cover activating device 10, closing of the cover 92 due to own weight is suppressed by the differential gear reduction mechanism 62d which transmits power from the motor 61 to the cover 92 at a higher efficiency than that of a worm gear. Therefore, the efficiency of transmission of power from the motor 61 to the cover 92 can be improved as compared with the case where closing of a cover due to its own weight can be suppressed by a worm gear.

In the cover activating device 10, the reduction ratio of the first reducer 62 or the second reducer 63 can be controlled simply by adjusting the reduction ratio of the spur gear 62c or the spur gear 63c which is the first stage reduction mechanism. Therefore, the reduction ratio of the first reducer 62 or the second reducer 63 can be easily controlled as compared with the case where the reduction ratio of the first reducer 62 or the second reducer 63 can be controlled only after the reduction ratio of the differential gear reduction mechanism 62d or the differential gear reduction mechanism 63d is adjusted.

In the cover activating device 10, as described above, the plate springs 43, 44 enable the cover 92 to be moved in the thickness direction of the cover 92 indicated by the arrow 11. When the cover 92 is closed, therefore, the cover 92 can make contact with the O-ring of the case 91 without causing a shock, and closely adhere at a uniform pressure with the O-ring of the case 91. During the process of combining the cover activating device 10, the case 91, and the cover 92 with each other, therefore, steps of positioning and adjusting them with using actual components can be omitted, and the durability of the O-ring of the case 91 can be maintained.

In the cover activating device 10, the spring constants of the plate springs 43, 44 in the directions of the arrows 11, 12, 13 are 74 N/mm, 336 N/mm, and 900 N/mm, respectively, or the spring constants in the directions of the arrows 12, 13 are larger than the spring constant in the direction of the arrow 11. Therefore, swinging of the cover 92 in the directions of the arrows 12, 13 can be suppressed while enabling the cover 92 to be moved in the direction of the arrow 11.

In the cover activating device 10, when the cover 92 is closed, the bending angle 43a of the plate spring 43 and the bending angle of the plate spring 44 are 105° or not an acute angle, and, during the process of opening or closing the cover 92, the bending angle 43a of the plate spring 43 and the bending angle of the plate spring 44 are not formed as an acute angle. Therefore, repeated fatigue of the plate springs 43, 44 due to opening and closing of the cover 92 is hardly caused as compared with the case where, during the process of opening or closing the cover 92, the bending angle 43a of the plate spring 43 and the bending angle of the plate spring 44 are formed as an acute angle. In the cover activating device 10, when the cover 92 is closed, the bending angle 43a of the plate spring 43 and the bending angle of the plate spring 44 are not formed as an acute angle, and, when no load is applied to the plate springs 43, 44, the bending angle 43a of the plate spring 43 and the bending angle of the plate spring 44 are not formed as an acute angle. Therefore, the plate springs 43, 44 can be easily shaped as compared with the case where, when no load is applied to the plate springs 43, 44, the bending angle 43a of the plate spring 43 and the bending angle of the plate spring 44 are formed as an acute angle.

In the cover activating device 10, the plate springs 43, 44 are fixed to the cover 92 via the spring seat plates 45 to 48. Alternatively, the plate springs 43, 44 may be fixed directly to the cover 92.

In the cover activating device 10, each of the plate springs 43, 44 is formed by a single elastic member. Alternatively, each of the plate springs 43, 44 may be formed by plural elastic members.

In the cover activating device 10, the gap 50a (see FIG. 3) between the plate 92a fixed to the cover 92 and the block 49 is measured by the sensor 50. In the case where the plate 92a is not fixed to the cover 92, the gap between the cover 92 and the block 49 may be measured by the sensor 50.

The cover activating device 10 is fixed to the side face 91b which is one of the four side faces of the case 91. Therefore, a loading and unloading port for a product such as a liquid crystal display device may be formed in one of the four side faces of the case 91 other than the side face 91b.

The cover activating device 10 is configured so as to open and close the cover 92 of the vacuum chamber 90 for producing a semiconductor device. Alternatively, the apparatus may be configured so as to open and close a cover of a container other than the vacuum chamber 90.

As described above, the activating device for a cover according to the invention attains an effect that it can be made smaller in size than a conventional apparatus, and is useful as, for example, an activating device for a cover of a vacuum chamber for producing a semiconductor device.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An actuator comprising:
   a motor (61) which outputs rotation;
   a first reducer (62) which receives the rotation from the motor, and outputs the rotation after reducing; and
   a second reducer (63) which receives the rotation from the first reducer, and outputs the rotation after reducing;
   wherein the first reducer includes a first gear (61a) rotated by the rotation from the motor, a first spur gear mechanism (62a) having a second gear (62c) meshed with the first gear, and a first differential gear mechanism (62d) further reducing the rotation from the first spur gear mechanism; and
   the second reducer includes a third gear (62b) rotated by the rotation from the first reducer, a second spur gear mechanism (63a) having a fourth gear (63c) meshed with the third gear, and a second differential gear mechanism (63d) further reducing the rotation from the second spur gear mechanism;
   wherein the first gear (61a) rotated by the rotation from the motor and the third gear (62b) rotated by the rotation from the first reducer are disposed coaxial to each other.

2. The actuator according to claim 1, wherein the first gear (61a) is supported by an output portion of the motor, and the first differential gear mechanism (62d) is disposed between the first spur gear mechanism (62a) and the motor, and
   wherein the third gear (62b) is supported by an output portion of the first differential gear mechanism, and the second differential gear mechanism (63d) is disposed between the second spur gear mechanism (63a) and the first reducer.

3. The actuator according to claim 1, wherein the first spur gear mechanism includes a reducing mechanism reducing the rotation of the motor, and the second spur gear mechanism includes a reducing mechanism reducing the rotation of the first reducer.

4. An activating device for a cover, in a container (90) including a case (91), and a cover (92), comprising:
   an actuator (60) according to claim 1;
   a shaft unit (20) having a rotary shaft (21) driven by the actuator and the rotary shaft being rotatably supported on the case; and
   a coupling unit (40) coupling said cover and the rotary shaft,
   wherein the cover is opened or closed when the rotary shaft is driven by the actuator.

* * * * *